United States Patent [19]

Komori et al.

[11] Patent Number: 5,098,855

[45] Date of Patent: Mar. 24, 1992

[54] SEMICONDUCTOR DEVICE AND METHOD OF PRODUCING THE SAME

[75] Inventors: Kazuhiro Komori, Kodaira; Kenichi Kuroda, Tachikawa, both of Japan; June Sugiura, Troy, N.Y.

[73] Assignee: Hitachi, Ltd., Tokyo, Japan

[21] Appl. No.: 479,151

[22] Filed: Mar. 28, 1990

Related U.S. Application Data

[60] Division of Ser. No. 291,647, Dec. 29, 1988, Pat. No. 4,918,501, which is a continuation of Ser. No. 10,998, Feb. 5, 1987, abandoned, which is a division of Ser. No. 736,770, May 22, 1985, Pat. No. 4,663,645.

[30] Foreign Application Priority Data

May 23, 1984 [JP] Japan .................................. 59-102555
Aug. 13, 1984 [JP] Japan .................................. 59-167825

[51] Int. Cl.$^5$ ...................... H01L 21/70; H01L 27/00
[52] U.S. Cl. ........................................ 437/52; 437/40; 437/41; 437/44; 437/51
[58] Field of Search ...................... 437/52, 44, 43, 40, 437/48, 51, 29, 41

[56] References Cited

U.S. PATENT DOCUMENTS

| | | | |
|---|---|---|---|
| 3,984,822 | 10/1976 | Simko et al. | 437/52 |
| 4,109,371 | 8/1978 | Shibata et al. | 437/43 |
| 4,114,255 | 9/1978 | Salsbury et al. | 437/43 |
| 4,198,250 | 4/1980 | Jecmen | 437/44 |
| 4,257,832 | 5/1981 | Schwabe et al. | 437/41 |
| 4,267,632 | 5/1981 | Shappir | 437/49 |
| 4,295,897 | 10/1981 | Tubbs et al. | 437/48 |
| 4,302,766 | 11/1981 | Guterman et al. | 437/43 |
| 4,317,272 | 3/1982 | Kuo et al. | 437/49 |
| 4,317,273 | 3/1982 | Guterman et al. | 437/43 |
| 4,326,331 | 4/1982 | Guterman | 437/43 |
| 4,355,455 | 10/1982 | Boettcher | 437/43 |
| 4,356,623 | 11/1982 | Hunter | 437/41 |
| 4,367,580 | 1/1983 | Guterman | 437/48 |
| 4,372,031 | 2/1983 | Tsaur et al. | 437/52 |
| 4,373,248 | 2/1983 | McElroy | 437/52 |
| 4,373,249 | 2/1983 | Kosa et al. | 437/52 |
| 4,376,947 | 5/1983 | Chiu | 437/52 |
| 4,382,827 | 5/1983 | Romano-Moran et al. | 437/44 |
| 4,404,733 | 9/1983 | Sasaki | 437/41 |
| 4,420,870 | 12/1983 | Kimura | 437/29 |
| 4,420,871 | 12/1983 | Scheibe | 437/43 |
| 4,426,764 | 1/1984 | Kosa et al. | 437/52 |
| 4,433,468 | 2/1984 | Kawamata | 437/44 |
| 4,554,729 | 11/1985 | Tanimura et al. | 437/52 |
| 4,566,175 | 1/1986 | Smayling et al. | 437/43 |
| 4,663,645 | 5/1987 | Komori et al. | 357/23.3 |
| 4,686,558 | 8/1987 | Adam | 357/23.5 |
| 4,883,543 | 11/1989 | Gossen, Jr. et al. | 437/52 |
| 4,918,501 | 4/1990 | Komori et al. | 357/23.5 |

FOREIGN PATENT DOCUMENTS 53-89686 7/1978 Japan ................................ 437/43

Primary Examiner—Brian E. Hearn
Assistant Examiner—Kevin M. Picardat
Attorney, Agent, or Firm—Antonelli, Terry, Stout & Kraus

[57] ABSTRACT

Disclosed is a semiconductor integrated circuit device which includes first field effect transistors of a LDD structure having a floating gate as memory cells and second field effect transistors of the LDD structure as elements other than the memory cells, and which is used as EPROM. A shallow, low impurity concentration region of the first field effect transistor as a part of its source or drain region has a higher impurity concentration than a shallow, low impurity concentration region of the second field effect transistor as a part of its source or drain region.

45 Claims, 10 Drawing Sheets

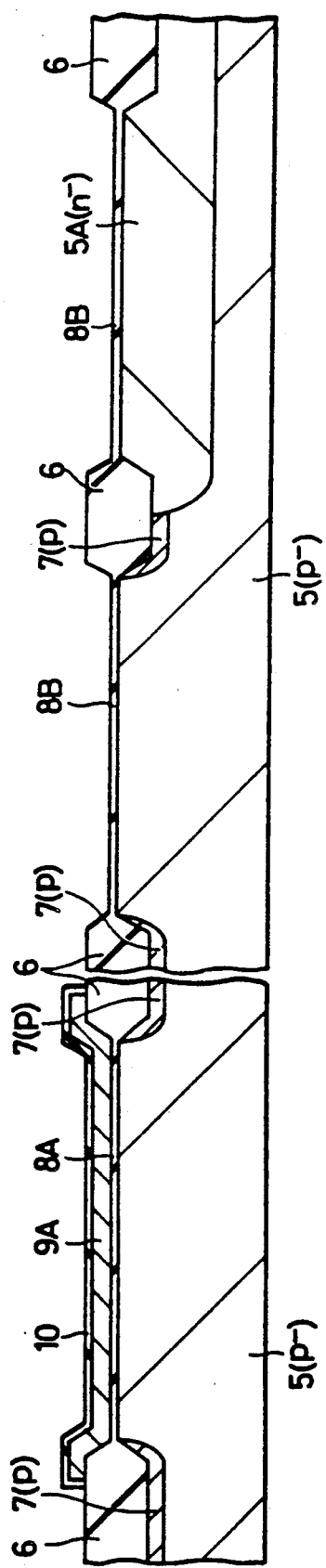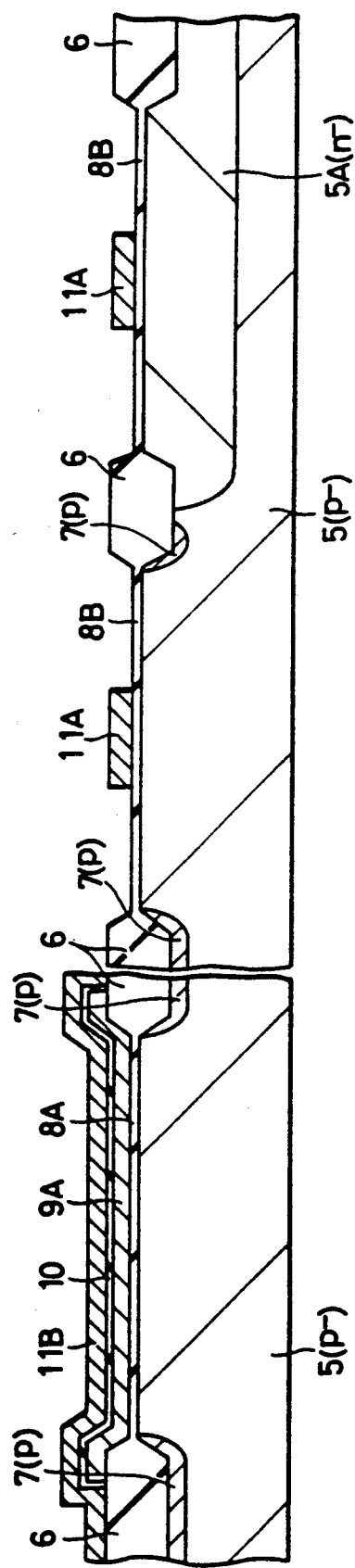

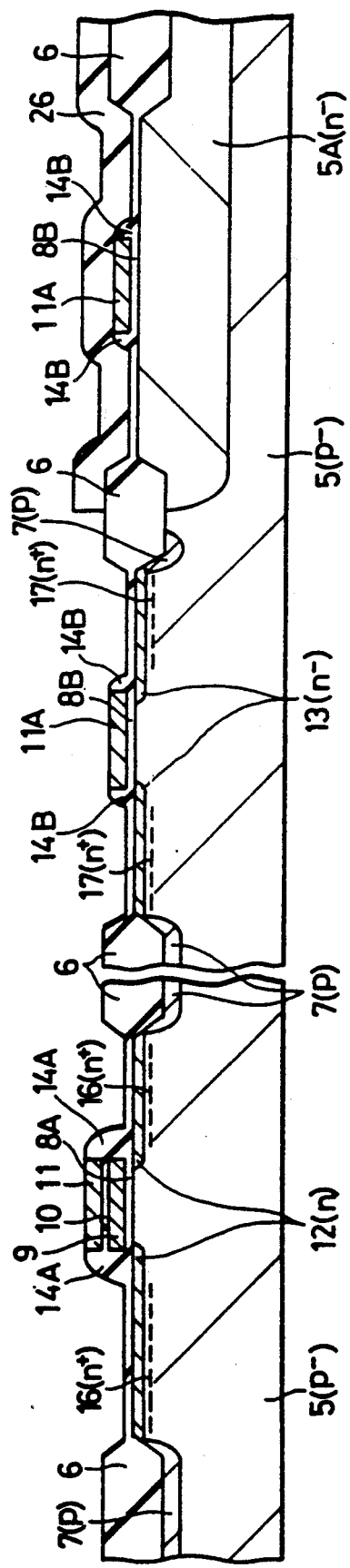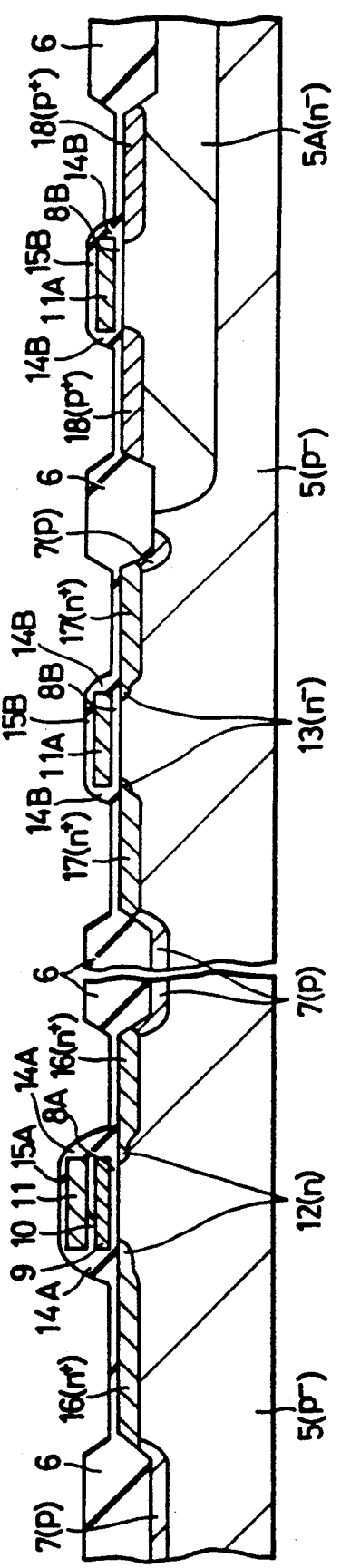

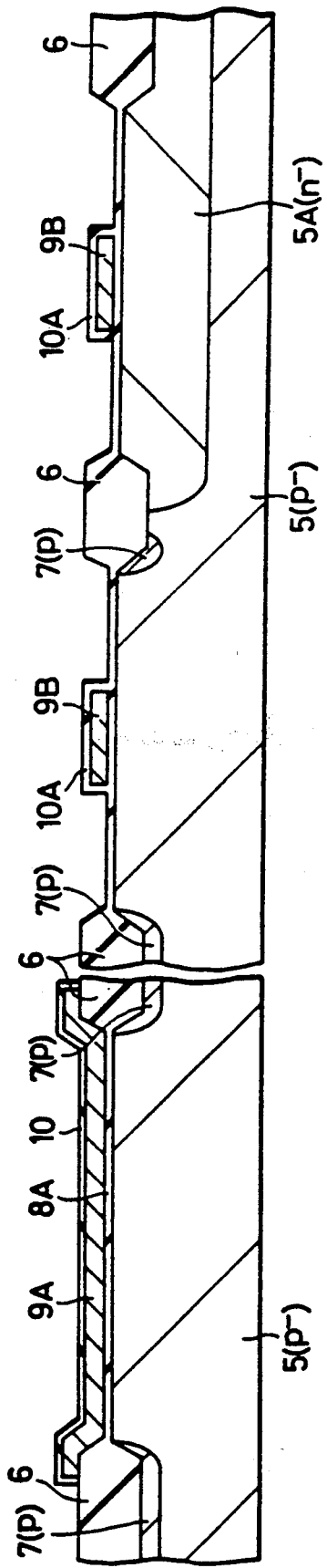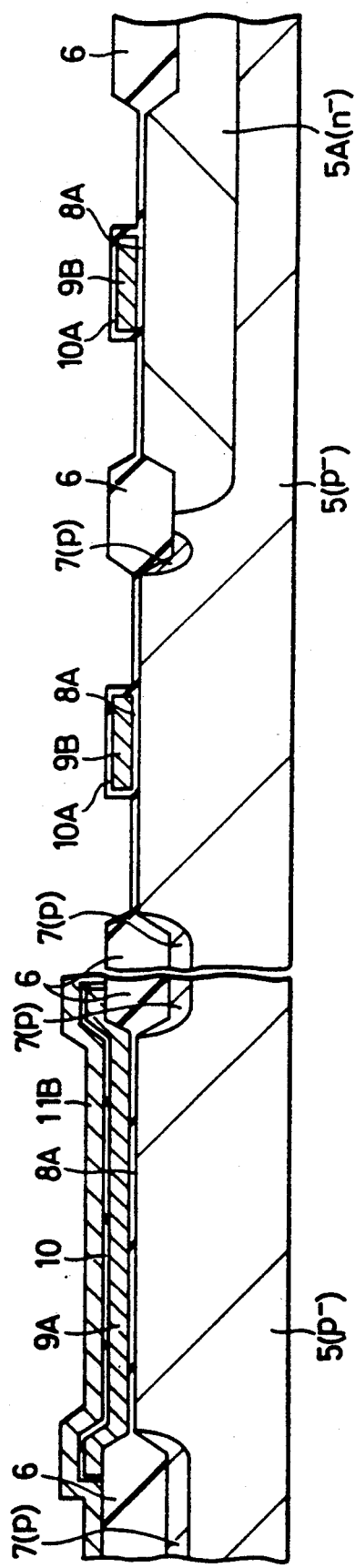

SEMICONDUCTOR DEVICE AND METHOD OF PRODUCING THE SAME

This is a divisional of application Ser. No. 07/291,647, filed Dec. 29, 1988 now U.S. Pat. No. 4,918,501; which is a continuation application of application Ser. No. 07/010,998, filed Feb. 5, 1987 now abandoned, which is a divisional application of application Ser. No. 06/736,770, filed May 22, 1985 now U.S. Pat. No. 4,663,645.

BACKGROUND OF THE INVENTION

This invention relates generally to a semiconductor integrated circuit device, and more particularly to a technique which is effective when applied to a semiconductor integrated circuit device equipped with a read-only memory function and capable of electrically programing data and of erasing the data.

One of the most important technical problems to be solved for EPROM as an example of semiconductor devices using field effect transistors having a floating gate as memory cells is to shorten write-in time by improving writing efficiency and to shorten read-out time by improving reading efficiency.

Writing efficiency can be improved by intensifying the electric field close to the drain region of a memory cell and increasing the injection quantity of hot carriers into the floating gate.

Reading efficiency can be improved by reducing the channel resistance of the memory cell and increasing the intensity of current flowing through the source and drain regions.

The electric field near the drain region can be intensified and the channel resistance can be reduced by, for example, converting the memory cell, that is, the field effect transistor, to a short channel type.

However, when a highly integrated EPROM having a channel length of below about 1.5 $\mu$m is fabricated, a phenomenon occurs in which the threshold voltage of the memory cell fluctuates considerably due to the short channel effect.

Therefore, the inventor of the present invention has attempted to apply a lightly doped drain (LDD) structure to the EPROM memory cell. For details of the LDD structure, refer, for example, to "IEEE Transactions on Electron Devices", Vol. ED-29, No. 4, April, 1982, pp 590–596.

As a result of experiments and examination regarding this this technique, however, the inventor of the present invention has found the following problems when an LDD structure is applied to a field effect transistor which is an EPROM memory cell:

(1) A region, which is formed between a region to be formed as a channel of the field effect transistor in which the memory cell and a virtual drain region having a high impurity concentration, is formed with a low impurity concentration such as about $1 \times 10^{13}$ atoms/cm$^2$. Therefore, the p-n junction formed by a semiconductor substrate and the low impurity concentration region is one that is formed mutually by a p-n junction between the low impurity concentration regions. This in turn reduces field intensity near the drain region; hence, writing efficiency drops.

(2) The low impurity concentration region has a high resistance of about 1 K$\Omega$/$\square$ which is about 20 to 30 times higher than the resistance of the virtual drain region. Therefore, the intensity of the current that flows between the source and drain regions of the field effect transistor decreases; hence, the reading efficiency falls off.

(3) Because of the problems described in the items (1) and (2) above, the size of the memory cell cannot be reduced by converting the field effect transistor of the memory cell to the short channel type, so that the integration density of the EPROM cannot be improved.

(4) Because of problems (1) through (3), high-density integration, high writing efficiency and high reading efficiency for the EPROM cannot be accomplished.

SUMMARY OF THE INVENTION

It is an object of the present invention to provide technical means capable of improving the integration density of an EPROM.

It is another object of the present invention to provide technical means capable of improving the writing efficiency of an EPROM.

It is still another object of the present invention to provide technical means capable of improving the reading efficiency of an EPROM.

It is still another object of the present invention to provide technical means capable of accomplishing high-density integration, improved writing efficiency and improved reading efficiency for an EPROM.

It is a further object of the present invention to provide technical means capable of accomplishing high-density integration, improved writing efficiency and improved reading efficiency for an EPROM, and also capable of improving the dielectric breakdown of peripheral circuit devices.

These and other objects and novel features of the present invention will become more apparent from the following description to be taken in conjunction with the accompanying drawings.

Among the inventions disclosed herein, the following is a typical example.

Both the field effect transistors of the memory cells of an EPROM and the field effect transistors of peripheral circuits have an LDD structure, and the low impurity concentration region of the field effect transistors of the memory cells are formed with a higher impurity concentration than the low impurity concentration region of the field effect transistors of the peripheral circuits. This arrangement can intensify the electric field near the drain region of the field effect transistor of a memory cell and can reduce the resistance of the drain region, so that both writing efficiency and reading efficiency of an EPROM can be improved.

In the field effect transistor of the memory cell, the arrangement described above can reduce the extension of a depletion region formed from the source and drain regions into a semiconductor substrate, and can convert the field effect transistor to a short channel type, so that the integration density of an EPROM can be improved.

BRIEF DESCRIPTION OF THE DRAWINGS

FIGS. 4 through 10 are sectional views, showing the principal portions of the EPROM memory cells and the CMIS constituting the peripheral circuit at each production step, useful for explaining the production method in accordance with a first embodiment of the present invention:

FIGS. 11 and 12 are sectional views showing the principal portions of the memory cells of the EPROM and the CMIS constituting the peripheral circuit at each production step, useful for explaining the production method in accordance with a second embodiment of the present invention;

DESCRIPTION OF THE PREFERRED EMBODIMENTS

Figure 1:
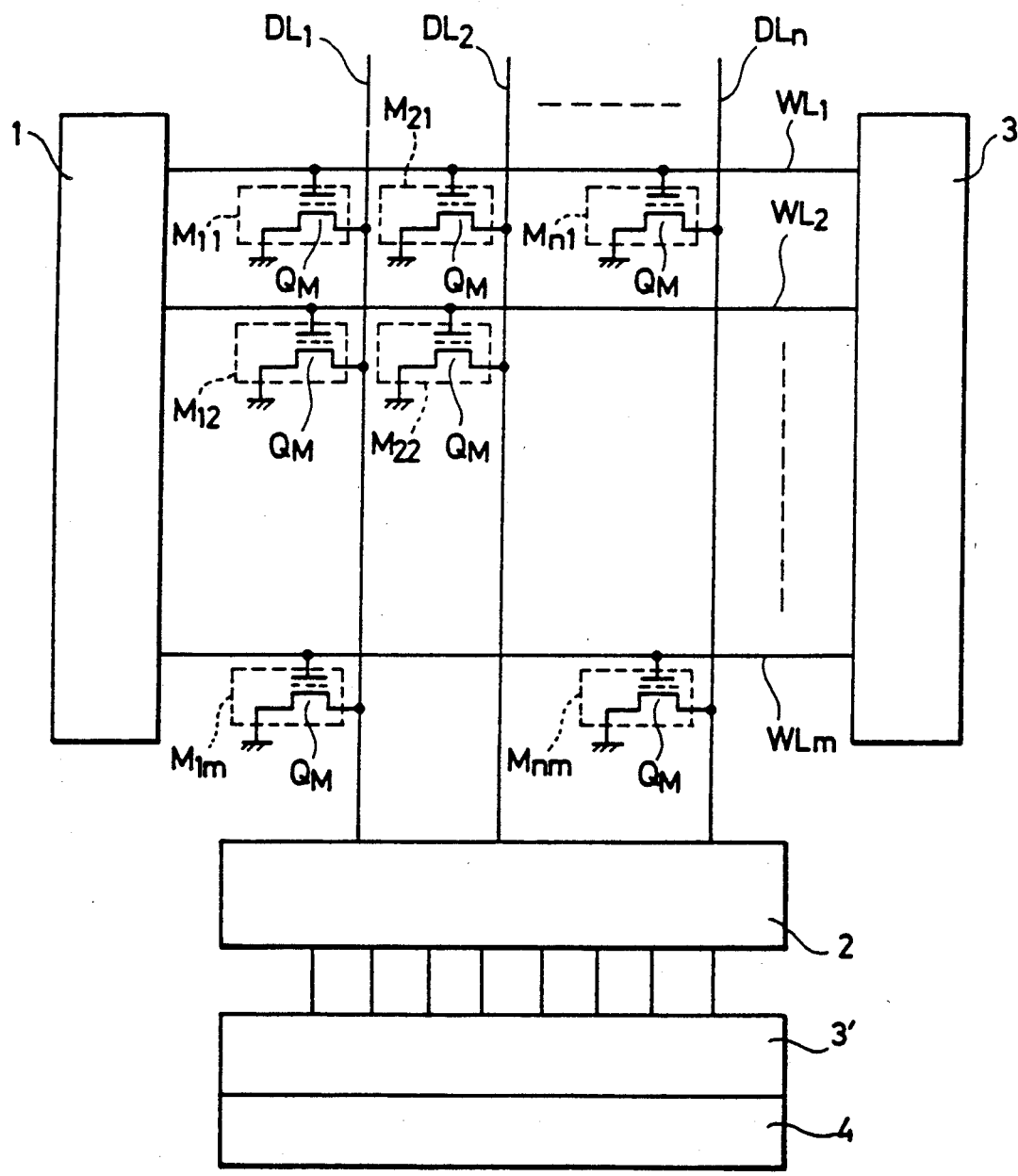
FIG. 1 is an equivalent circuit diagram showing an EPROM memory cell array, useful for explaining the present invention.

Hereinafter, the construction of the present invention will be described with reference to some preferred embodiments thereof. Constituents having the same function will be represented by the same reference numeral throughout the drawings; the repetition of explanation of such constituents will be omitted.

FIG. 1 is an equivalent circuit diagram which shows the memory cell array of an EPROM, useful for explaining the summary of the first embodiment of the present invention.

In the drawing, reference numeral 1 represents an X decoder, which selects a predetermined word line, which will be described later, and which turns ON a predetermined memory cell connected to the selected word line.

Reference numeral 2 represents a Y decoder, which selects a predetermined data line, which will be described later, and which applies a voltage as data to the selected data line.

Reference numerals 3 and 3' represent write-in circuits, which respectively select predetermined word and data lines, which will be described later, and which write data into the predetermined memory cell connected to the selected word and data lines.

Reference numeral 4 represents a sense amplifier, which reads out the data of a predetermined memory cell connected to a data line.

The X decoder 1, the Y decoder 2, the write-in circuits 3, 3' and the sense amplifier 4 together constitute an EPROM peripheral circuit.

Symbols $WL_1$, $WL_2$, ..., $WL_m$ represent the word lines. One of the ends of each word line is connected to the X decoder 1 while the other end is connected to the write-in circuit 3. A plurality of word lines are disposed in such a manner as to extend in the X direction. These word lines WL turn ON the memory cells connected thereto, and write the data.

Symbols $DL_1$, $DL_2$, ..., $DL_n$ represent the data lines. One of the ends of each data line is connected to the Y decoder 2, which is also connected to the write-in circuit 3' and to the sense amplifier 4. A plurality of these data lines are disposed in such a manner as to extend in the Y direction, and transmit data from the memory cells connected thereto.

Symbols $M_{11}$, $M_{12}$, ..., $M_{nm}$ represent the memory cells. A plurality of memory cells are disposed at predetermined points of intersection between the word lines WL and the data lines DL. Each memory cell M comprises a field effect transistor $Q_M$ which has a floating gate and a control gate which is connected to a predetermined word line WL, and whose one end is connected to a predetermined data line DL with the other end being grounded. The memory cell stores the EPROM data.

A plurality of memory cells M are disposed in a matrix, thereby forming a memory cell array.

Next, the definite construction of this embodiment will be described.

Figure 2:
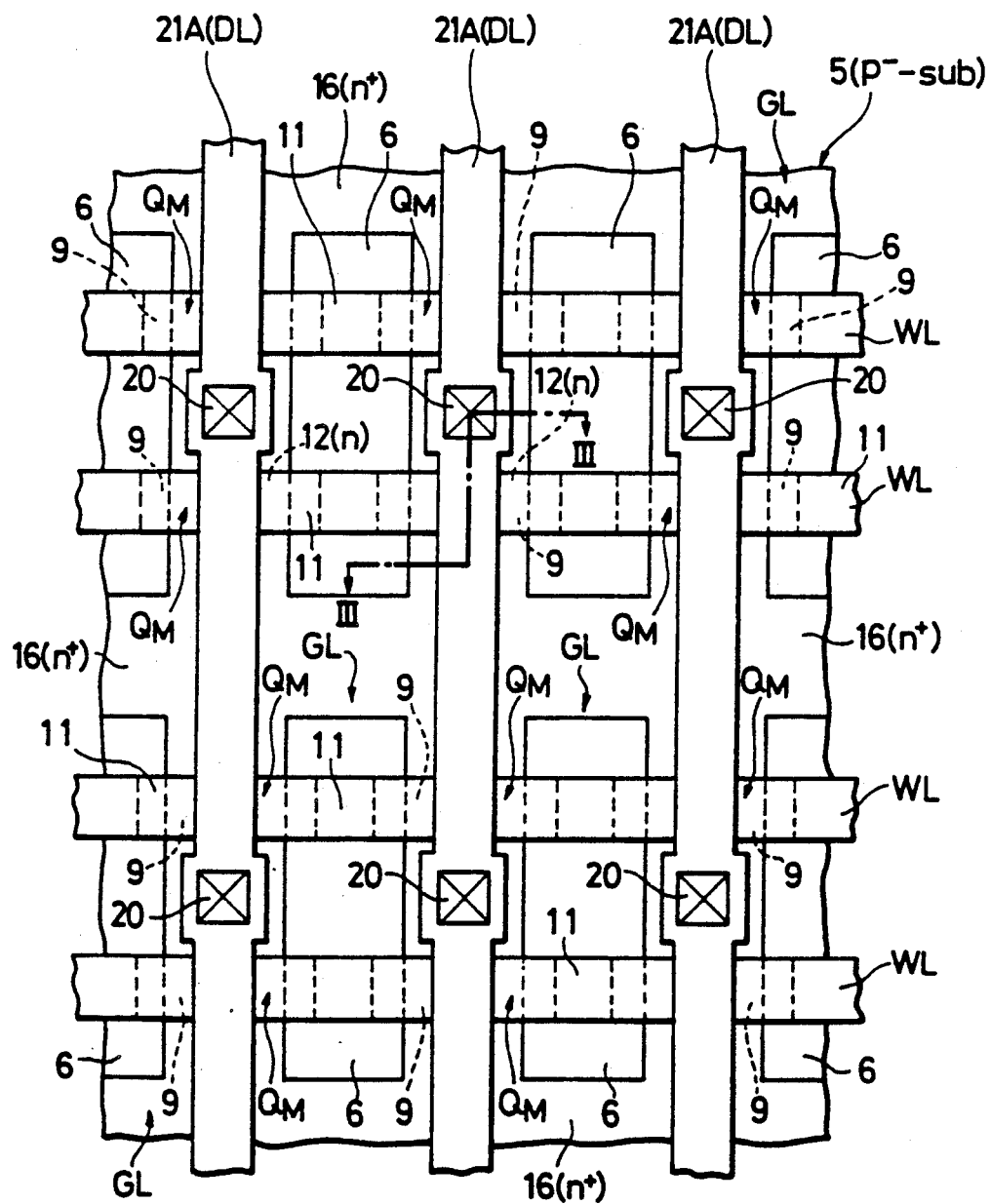
FIG. 2 is a plan view showing the principal portions of the memory cell array of an EPROM, useful for explaining the present invention.
Figure 3:
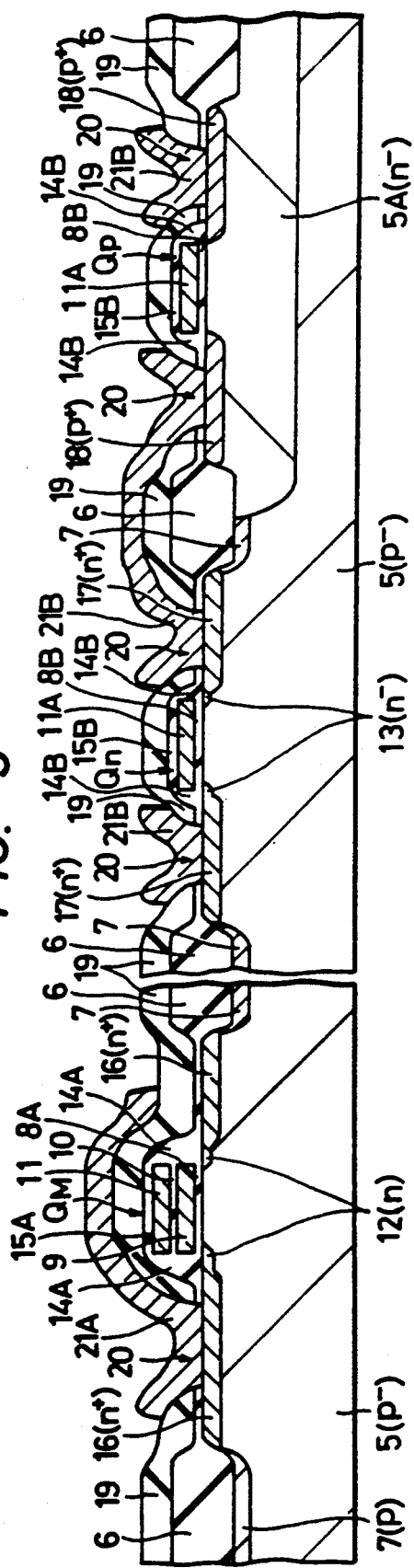
FIG. 3 is a sectional view taken along the line III—III of FIG. 2, showing the principal portions of the memory cell and the CMIS constituting a peripheral circuit.

FIG. 2 is a plan view which shows the principal portions of the EPROM memory cell array, useful for explaining the first embodiment of the present invention, and FIG. 3 is a sectional view which shows the principal portions of the memory cell (on the left) along line III—III of FIG. 2 and a complementary MISFET (on the right) that constitutes a peripheral circuit.

In these drawings, reference numeral 5 represents a p⁻ type semiconductor substrate consisting of single crystal silicon, and 5A is an n⁻ type well region which is formed at a predetermined portion on the main surface of the semiconductor substrate 5 and constitutes an EPROM.

Reference numeral 6 represents a field insulating film between regions, in which the semiconductor device is to be formed primarily, at the upper portion on the main surface of the semiconductor substrate 5 or the well region 5A. The insulating film electrically isolates the semiconductor devices from one another.

Reference numeral 7 represents a p⁺ type channel stopper region disposed on the main surface of the semiconductor substrate 5 below the field insulating film 6 in order to electrically isolate the semiconductor devices.

Reference numerals 8A represents an insulating film formed at the upper portion on the main surface of the semiconductor substrate 5, and reference numeral 8B represents an insulating film disposed at the upper portion on the main surface of the semiconductor substrate 5 or the well region 5A, and primarily constitutes the gate insulating film of the field effect transistor.

Reference numeral 9 represents a conductive layer disposed at a predetermined upper portion of the insulating film 8A, and constitutes the floating gate of the EPROM memory cell.

Reference numeral 10 represents an insulating film disposed in such a manner as to cover the conductive layer 9. This film 10 primarily isolates electrically the conductive layer 9 from a conductive layer or layers that are disposed on the former.

Reference numeral 11 represents a conductive layer which is disposed on a plurality of conductive layers disposed in an X direction via an insulating film 10, which forms the control gate of the EPROM memory cell on the region in which the semiconductor device is to be formed, that is, on the conductive layer 9, and which also constitutes a word line WL of EPROM.

Reference numeral 11A represents a conductive layer disposed at a predetermined upper portion of the insulating film 8B, and which constitutes the gate electrode of the field effect transistor of the peripheral circuit.

Reference numeral 12 represents an n type semiconductor region which is formed on the main surface of the semiconductor substrate 5 on both sides of the conductive layers 9 and 11 via the insulating film 8A, and constitutes the LDD structure of the field effect transistor of the memory cell.

Reference numeral 13 represents an n⁻ type semiconductor region formed on the main surface of the semiconductor substrate 5 on both sides of the conductive layer 11 via the insulating film 8B, and constitutes the LDD structure of the field effect transistor of the peripheral circuit.

Reference numeral 14A represents an insulating film disposed on both sides of the conductive layers 9 and 11, and reference numeral 14B represents an insulating film disposed on both sides of the conductive layer, 11A. The insulating films 14A, 14B are side walls which are used in the formation of the source and drain regions of the field effect transistor in the LDD structure in a manner which will be described in detail hereinafter.

Reference numeral 15A represents an insulating film disposed in such a fashion as to cover the upper portion of the conductive layer 11, while reference numeral 15B represents an insulating film disposed in such a fashion as to cover the upper portion of the conductive layer 11A.

Reference numeral 16 represents an n+ type semiconductor region which is disposed on the main surface of the semiconductor substrate 5 on both sides of the insulating film 14A of the region, in which the semiconductor device is to be formed, and which is used as a substantial source or drain region or a ground line (GL). This region 16 is primarily to constitute the field effect transistor as the memory cell of the EPROM.

Reference numeral 17 represents an n+ type semiconductor region which is disposed on the main surface of the semiconductor substrate 5 via the insulating film 8B on both sides of the insulating film 14B of the region, in which the semiconductor device is to be formed, and is used as a virtual source or drain region. This region 17 is primarily to constitute the n-channel field effect transistor of the peripheral circuit.

Reference numeral 18 represents a p+ semiconductor region which is formed on the main surface of the well region 5A on both sides of the insulating film 14B of the region, in which the semiconductor device is to be formed, via the insulating film 8B; is used as the source and drain regions; and constitutes the p-channel field effect transistor of the peripheral circuit.

The memory cell M of the EPROM, that is, the field effect transistor $Q_M$, consists primarily of the semiconductor substrate 5, the conductive layer 9 disposed at the upper portion of the substrate via the insulating film 8A, the conductive layer 11 formed at the upper portion of the conductive layer 9 via the insulating film 10, the pair of semiconductor regions 16 and the semiconductor region 12 (the low impurity concentration region) disposed between the channel forming region and the semiconductor region 16.

The n-channel field effect transistor $Q_n$ of the EPROM peripheral circuit consists primarily of the semiconductor substrate 5., the conductive layer 11A formed at the upper portion of the substrate via the insulating film 8B, the pair of semiconductor regions 17 and the semiconductor region 13 (the low impurity concentration region) disposed between the channel forming region and the semiconductor region 17.

The p-channel field effect transistor $Q_p$ of the EPROM peripheral circuit consists primarily of the well region 5A, the conductive layer 11A formed at the upper portion of the well region 5 via the insulating film 8B, and the pair of semiconductor regions 18.

The field effect transistor $Q_n$ and the field effect transistor $Q_p$ together form a complementary MIS logic component.

The semiconductor region 12 as the low impurity concentration region of the field effect transistor $Q_M$ has an impurity concentration which is lower than that of the semiconductor region 16 of the field effect transistor $Q_M$ and that of the semiconductor region 17 of the field effect transistor $Q_n$, but has a higher impurity concentration than that of the semiconductor region 13 as the low impurity concentration region of the field effect transistor $Q_n$.

The structure described above provides the following advantages when compared with the case where the same LDD structure (using the same impurity concentration) as that of the field effect transistor $Q_n$ is used as the structure of the field effect transistor $Q_M$. First of all, the electric field formed close to the drain region (semiconductor region 12) of the field effect transistor $Q_M$ can be intensified, and the resistance of the source and drain regions (semiconductor region 12) can be reduced. Second, the extension of the depletion layer that is formed from the p-n junction between the channel forming region of the semiconductor substrate 5 and the source and in regions (semiconductor region 12) can be restricted, and the field effect transistor $Q_M$ can be converted to the short channel type.

Reference numeral 19 represents an insulating film which is disposed in such a manner as to cover the semiconductor devices such as the field effect transistors $Q_M$, $Q_n$ and $Q_p$, and electrically isolates them from the conductive layers to be disposed thereon.

Reference numeral 20 represents contact holes that are bored by selectively removing the insulating films 8A, 8B and 19 at the upper portions of the predetermined semiconductor regions 16, 17 and 18, and electrically connect the semiconductor regions 16-18 to the conductive layers to be disposed on the insulating film 19.

Reference numeral 21A represents a plurality of conductive layers that electrically connect with the predetermined semiconductor region 16 via the contact hole 20 and which extend from the upper portion of the insulating film 19 in the Y direction in such a manner as to cross the conductive layer 11. They constitute the EPROM data lines DL.

Reference numeral 21B represents a conductive layer which electrically connects with the predetermined semiconductor regions 17 and 18 via the contact hole 20 and constitutes a CMIS inverter with the field effect transistors $Q_n$ and $Q_p$.

Next, the specific production method in accordance with the embodiment I of the present invention will be described with reference to a case in which the control gate of the field effect transistor of the memory cell and the gate electrode of the field effect transistor of the peripheral circuit are formed in the same production step.

FIGS. 4 through 10 are sectional views showing the principal portions of the memory cell of an EPROM and a CMIS constituting the peripheral circuit at each production step for the purpose of explaining the production method of the first embodiment of the invention.

First of all, a p⁻ type semiconductor substrate 5 consisting of single crystal silicon is prepared. An n⁻ type well region 5A is then formed on the main surface of the semiconductor substrate at its portion which is to become a region for forming a p-channel field effect transistor.

A field insulating film 6 and a p+ type channel stopper region 7 below the former are formed on the main surface of the semiconductor substrate 5 and on that of the well region 5A to be interposed between semiconductor devices.

Figure 4:
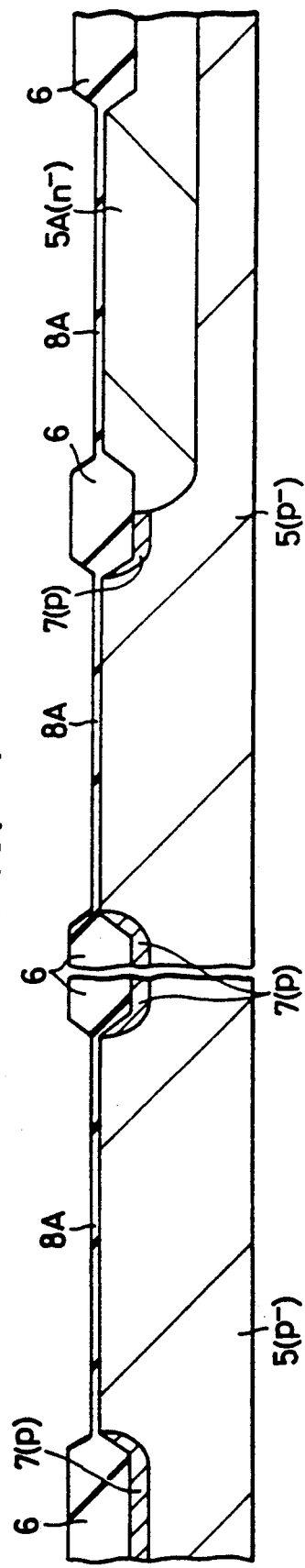

An insulating film 8A is formed on the main surfaces of the semiconductor substrate 5 and well region 5A so that it will primarily become the gate insulating film of a field effect transistor of a memory cell, as shown in FIG. 4. This insulating film 8A consists, for example, of a silicon dioxide film formed by thermal oxidation of the semiconductor substrate, and is about 300 to 350 Å thick.

After the production steps shown in FIG. 4, an impurity is introduced into the main surfaces of the semiconductor substrate 5 and well region 5A through the insulating film 8A in order to primarily adjust the threshold voltage of the field effect transistor which is to serve as the memory cell. The introduction of the impurity is effected by implantation of boron ions in a dosage of $1 \times 10^{12}$ atoms/cm², for example.

Thereafter, a first conductive layer in the production process is formed over the entire surface of the substrate. This conductive layer may consist of a polycrystalline silicon film formed by chemical vapor deposition (hereinafter called "CVD") into which phosphorus is doped in a high concentration in order to reduce resistance.

The conductive layer is then patterned in a predetermined shape in order to form the floating gate of the memory cell, thereby providing a conductive layer 9A. This step removes the insulating film 8A of the region for forming the field effect transistor of the peripheral circuit Then, the insulating layer 10 is formed selectively so as to cover the conductive layer. This insulating layer 10 may be formed, for example, of a silicon oxide layer having a thickness of about 250 to 350 Å. The insulating layer 10 is formed by thermal oxidation of the conductive layer 9A in such a situation that the region for forming a peripheral circuit is covered by a silicon nitride film.

As shown in FIG. 5, an insulating film 8B is formed on the main surface of the semiconductor substrate 5 and well region 5A of the region which is to form the field effect transistor of the peripheral circuit so as to form a gate insulating film. The insulating film 8B is formed, for example, of silicon dioxide film having a thickness of about 200 to 300Å. The insulating film 8B is formed by thermal oxidation of semiconductor substrate 5 in such a situation that the region for forming memory cells is covered by a new silicon nitride film. This insulating film 8B can be formed simultaneously with the insulating film 10 in the same production step.

After the step shown in FIG. 5, an impurity is introduced into the main surfaces of the semiconductor substrate 5 and well region 5A through the insulating film 8B in order to primarily adjust the threshold voltage of the field effect transistor of the peripheral circuit. The introduction of the impurity is effected by implantation of boron ions at a dosage of $1 \times 10^{12}$ atoms/cm², for example. The region in which the memory cells are to be formed may be covered by a mask such as a silicon nitride film for forming the insulating film 8B.

Thereafter, a second conductive layer in the production process is formed over the entire surface of the substrate. This second conductive layer consists, for example, of a polycrystalline silicon layer formed by CVD into which phosphorus is introduced in a high concentration in order to reduce the resistance. This conductive layer is etched selectively, and a conductive layer 11B covering the conductive layer 9A via the insulating film 10 is formed on the entire surface of the memory cell region.

The conductive layer of the region, in which the field effect transistor of the peripheral circuit is to be formed, is patterned simultaneously and selectively thereby forming a conductive layer 11A which is to serve as a gate electrode, as shown in FIG. 6.

After the steps shown in FIG. 6, an etching mask 22 consisting of a resist is formed so as to form the floating gate and control gate of the memory cell. The conductive layers 11B, 9A and the insulating film 10 are etched using the etching mask 22, thereby forming the conductive layers 9 and 11. This prevents the etching of the insulating film 8B of the region, in which the peripheral circuit is to be disposed, and the etching of the surface of the substrate 5 or well region 5A; hence, the characteristics of MOSFETs of the peripheral circuit are not degraded.

Figure 7:
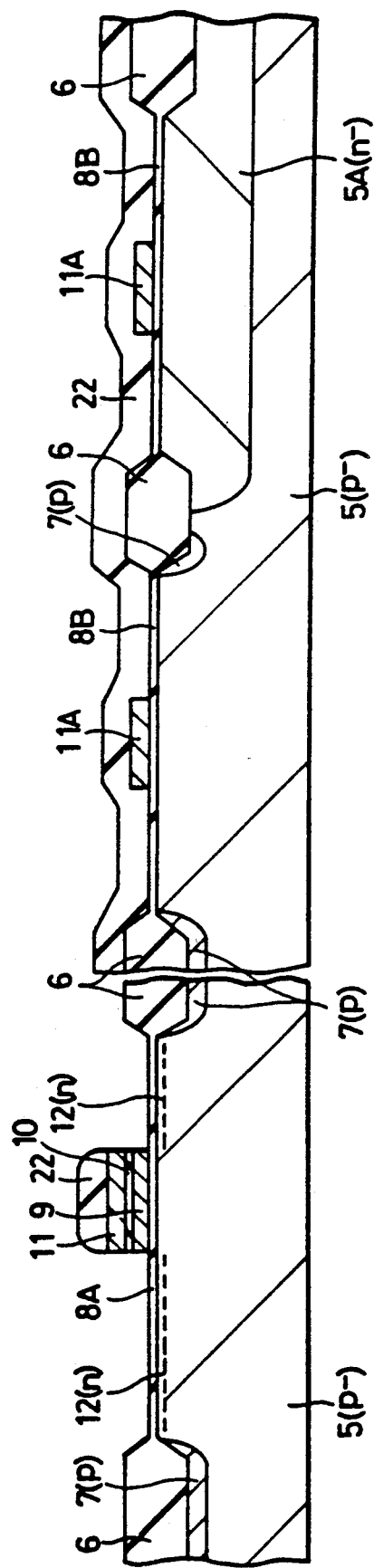

Ion implantation regions 12 are formed on the main surface of the substrate 5 on both sides of the conductive layers 9 and 11 using the etching mask 22 as a mask for introducing an impurity, as shown in FIG. 7, in order to provide the field effect transistor of the memory cell with the LDD structure. To form this region 12A, arsenic ions in a dosage of $1 \times 10^{13}$ to $1 \times 10^{15}$ atoms/cm² are introduced by ion implantation at an energy of about 80 KeV. As arsenic is used as the impurity, a shallow junction can be formed so that the surface concentration is relatively high, though the ion implantation dose is not great.

After the steps shown in FIG. 7, the etching mask 22 is removed.

An insulating(silicon oxide)film 23A covering conductive layers 9 and 11 and an insulating(silicon oxide)-film 23B covering the conductive layer 11A are then formed by thermal oxidation. They may be formed in such a manner as to cover at least the conductive layer 9 which is to serve as the floating gate, so as to prevent the unnecessary emission of the electrons as the information to be stored in the conductive layer 9, and to improve the retention characteristics of the information. The ion implantation region 12 is annealed by this thermal oxidation treatment, thereby forming an n type semiconductor region 12. This annealing treatment may be effected at other steps.

In order to provide the n-channel field effect transistor of the peripheral circuit with an LDD structure, an impurity introduction mask 24 consisting of a resist covering the p-channel field effect transistor and the like is formed.

Figure 8:
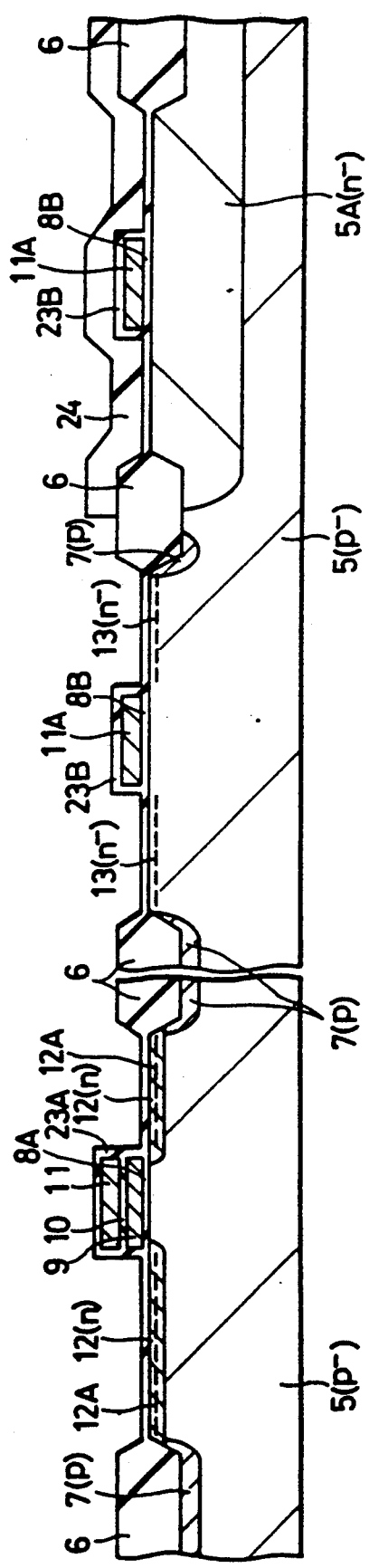

N⁻ type ion implantation regions 13 are formed on the main surface of the semiconductor substrate 5 on both sides of the conductive layer 11A using this impurity introduction mask 24 as shown in FIG. 8. At the same time, n type ions are implanted into the main surface of the semiconductor substrate 5 on both sides of the conductive layers 9 and 11, thereby forming ion implantation regions 12A. This ion implantation is effected with phosphorus ions at a dosage of $1 \times 10^{13}$ atoms/cm², for example, at energy of about 50 KeV. After the mask 24 is removed, annealing is conducted to form an n⁻ type semiconductor region 13. This annealing may be conducted at other production steps.

The impurity introduction mask 24 may also be formed on the field effect transistor of the memory cell so that phosphorus ions are not implanted into the semiconductor region 12. In other words, the impurity concentration of the LDD portion of the field effect transistor as the memory cell, that is, the impurity concentration of the semiconductor region 12, can be controlled at the step of forming the semiconductor region 12.

The insulating films 23A and 23B may be formed after forming the semiconductor region 13.

After the steps shown in FIG. 8, an insulating film is formed in such a manner as to cover the entire surface. A silicon oxide film which is formed by CVD at 600° to 800° C. at 1.0 Torr may be used as this insulating film.

This insulating film is etched anisotropically by reactive ion etching, for example, to form the insulating films 14A, 14B (side walls) on both sides of the conductive layers 9, 11 and the conductive layers 11A, respectively. In this case, the oxide film may remain on the conductive layers 11 and 11A.

Thereafter, ion implantation of an n⁻ type impurity is conducted using the conductive layers 9, 11, 11A, the field insulating film 6, the resist mask 26 and the insulating films 14A, 14B as the impurity introduction mask. N⁺ type ion implantation regions 16 and 17 are selectively formed on the main surface of the semiconductor substrate 5 of the region in which the field effect transistor as the memory cell is to be formed (the portion at which the semiconductor region 12 is formed), and on the main surface of the semiconductor substrate 5 of the region in which the n-channel field effect transistor of the peripheral circuit is to be formed (the portion at which the semiconductor region 13 is formed). Ion implantation is conducted using arsenic ions at dosage of $1 \times 10^{16}$ atoms/cm² at a 80 KeV, for example. The impurity concentration of the semiconductor regions 16 and 17 may be controlled at this forming step. After the mask 26 is removed, annealing is effected to form n⁺ type semiconductor regions 16 and 17.

Therefore, in the field effect transistor to serve as the memory cell, the impurity concentration of the semiconductor region 16 can be increased without regard to the impurity concentration of the semiconductor region 12 which controls the writing efficiency and the reading efficiency. This means that the resistance can be reduced remarkably. Therefore, the ground line GL (semiconductor region 16) extending inside the memory cell array can be reduced, and the reading efficiency can be further improved.

Though this embodiment uses arsenic ions for the formation of the semiconductor regions 16 and 17 in order to reduce the junction depth and to further shorten the channel, phosphorus ions are used for the formation of the semiconductor region 13. Therefore, the gradient of the impurity concentration is not steep, and particularly, the breakdown voltage of the semiconductor region 13 can be secured sufficiently.

After the steps shown in FIG. 9, an insulating film 15A covering the upper portion of the conductive layer 11 and an insulating film 15B covering the upper portion of the conductive layer 11A are formed by thermal oxidation This heat treatment may be used also as annealing for forming the semiconductor regions 16 and 17.

As shown in FIG. 10, p⁺ type semiconductor regions 18 are formed on the main surface of the well region 5A on both sides of the insulating film 14B. This semiconductor region 18 uses, for example, boron ions at a dosage of $1 \times 10^{15}$ atoms/cm², and may be formed by ion implantation and annealing at an energy of 80 KeV. In this case, the region in which the n-channel field effect transistor is to be formed must be covered with a mask.

Since the diffusion velocity of boron is high and since the concentration of ion implantation described above is high the B ion can sufficiently reach the under portion of the gate electrode 11A by annealing.

After the steps shown in FIG. 10, an insulating film 19 made of phosphosilicate glass, for example, is formed and contact holes 20 are then bored. As shown in FIGS. 2 and 3, conductive layers 21A and 21B made of aluminum are formed in such a manner as to electrically connect with the predetermined semiconductor regions 16, 17 and 18, thereby completing the EPROM in accordance with this embodiment.

Thereafter, a protective film, and the like, are formed

As described above, in this embodiment, the low impurity concentration region of the field effect transistor to serve as the memory cell is formed so as to have an impurity concentration lower than that of the other regions such as the source and drain regions but higher than the impurity concentration of the low impurity concentration region of the field effect transistor of the peripheral circuit. In comparison with the case where the same LDD structure as the field effect transistor of the peripheral circuit is employed for the field effect transistor of the memory cell, the arrangement described above provides the following advantages. First, the intensity of the electric field developing near the drain region of the field effect transistor of the memory cell can be increased; hence, the writing efficiency of the field effect transistor as a memory cell can be improved. Since the field effect transistor as the memory cell uses the LDD structure, an extension occurs of the depletion layer from the p-n junction between the substrate and the source and drain regions (particularly, the low impurity concentration region) into the semiconductor substrate is reduced. Therefore, the field effect transistor serving as the memory cell can be converted to the short channel type, the writing efficiency as well as the reading efficiency can be improved, the area of the memory cell can be reduced and the integration density of the EPROM can be improved.

The low impurity concentration region of the field effect transistor serving as the memory cell can be formed by use of the mask for forming its floating gate and control gate without increasing the number of production steps.

Since the low impurity concentration region of the field effect transistor serving as the memory cell, the low impurity concentration region of the field effect transistor of the peripheral circuit and their substantial source and drain regions are formed by separate steps, their impurity concentrations can be set to respective optimal values. Therefore, the virtual source and drain regions of the field effect transistor serving as the memory cell can be formed in a high impurity concentration, thereby reducing the resistance. This results in the improvement in the reading efficiency. Furthermore, the occupying area of the ground line extending inside the memory cell array can be reduced; hence, the integration density of the EPROM can be improved Since the virtual source and drain regions are formed by arsenic ions, impurities can be prevented from reaching the channel forming region, so that the channel length can be reduced and the integration density of the EPROM can be improved.

Next, the second embodiment of the present invention will be described. The second embodiment illustrates another production method of the first embodiment described above. That is, this embodiment illustrates the case where the floating gate of the field effect transistor of the memory cell and the gate electrode of the field effect transistor of the peripheral circuit are formed by the same production step.

FIGS. 11 and 12 are sectional views which show the principal portions of the memory cell of the EPROM and the complementary MISFET forming the peripheral circuit at each production step, and which are useful for explaining the second embodiment of the present invention.

After the production step of the first embodiment shown in FIG. 4, the first conductive layer in the production process is formed at the upper portions of the field insulating film 6 and insulating film 8A.

The conductive layer is then patterned to form conductive layers 9A and 9B in order to form the floating gate of the memory cell and the gate electrode of the peripheral circuit.

Thereafter, insulating films 10 and 10A are formed by thermal oxidation of the conductive layers 9A and 9B so as to cover the latter, as shown in FIG. 11.

After the step shown in FIG. 11, the second conductive layer of the production process is formed on the entire surface of the substrate.

As shown in FIG. 12, the conductive layer except that of the memory cell array is removed, thereby forming the conductive layer 11B on the memory cell array.

After the step shown in FIG. 12, the production steps after the step of the first embodiment shown in FIG. 7 are carried out to complete the EPROM of this embodiment.

As described above, this embodiment can provide substantially the same effect as that of the first embodiment.

Next, the third embodiment of the present invention will be described.

This embodiment contemplates reducing the resistance of the control gate of the memory cell and that of the gate electrode of the peripheral circuit to speed up the operating speed of the EPROM and improve the charge retention characteristics.

Figure 13:
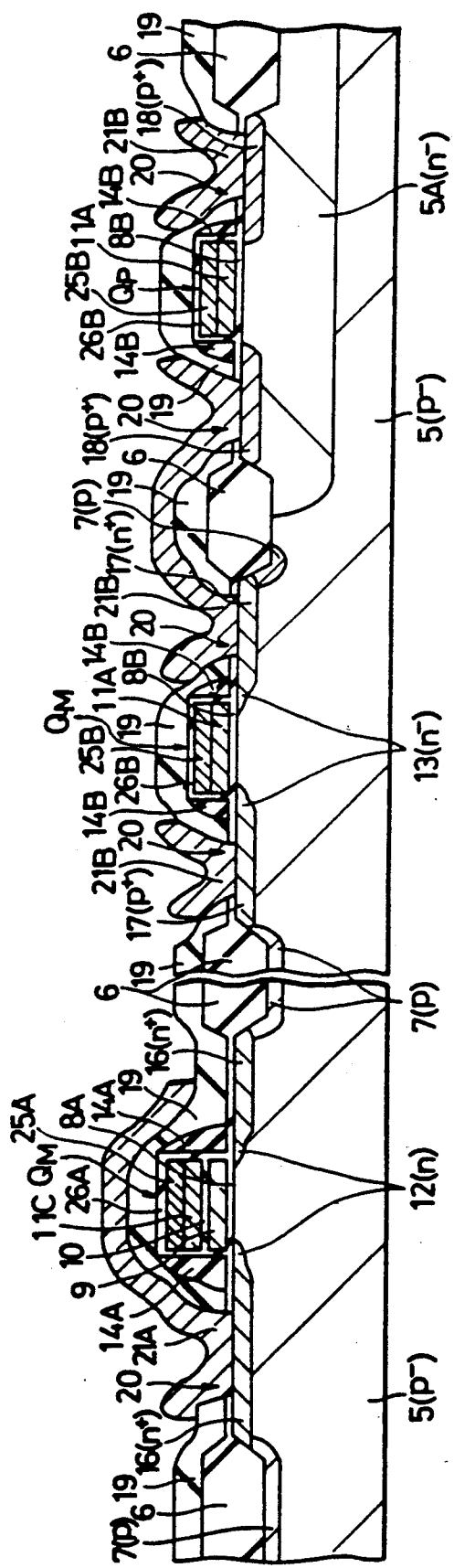
FIG. 13 is a sectional view showing the principal portions of the memory cells of the EPROM and the CMIS constituting the peripheral circuit, useful for explaining a third embodiment of the present invention.

FIG. 13 is a sectional view showing the principal portions of the memory cell of the EPROM and complementary MISFET constituting the peripheral circuit, useful for explaining the third embodiment of the invention Referring to the drawing, reference numerals 25A and 25B represent conductive layers deposited on the upper portions of the conductive layers 11C and 11A, and having lower resistance than the latter They are intended to speed up the operating speed of the EPROM.

Reference numerals 26A and 26B represent insulating films, which are disposed in such a manner as to cover the conductive layers 25A, 11C and 25B, 11A. The insulating film 26A, a dense silicon oxide film formed by thermal oxidation, improves the charge retention characteristics of the data stored in the conductive layer (floating gate) 9.

Next, the specific production method of the third embodiment will be described with reference to the case where the control gate of the field effect transistor of the memory cell and the gate electrode of the field effect transistor of the peripheral circuit are formed in the same production step.

After the step of the first embodiment shown in FIG. 5, conductive layers 11 and 25 are formed on the entire surface of the substrate The conductive layer 11 consists of the same reduced resistance polycrystalline silicon layer as that of the first embodiment. The conductive layer 25 may be made by sputtering of a refractory metal such as molybdenum, tungsten, tantalum or the like, or platinum, or silicides of these refractory metals or silicide of platinum. This embodiment uses tungsten silicide as the conductive layer 25. Next, these conductive layers 11 and 25 are selectively etched in order to form a conductive layer 11B on the entire surface of the memory cell region and a conductive layer 25C on the conductive layer 11B.

Figure 14:
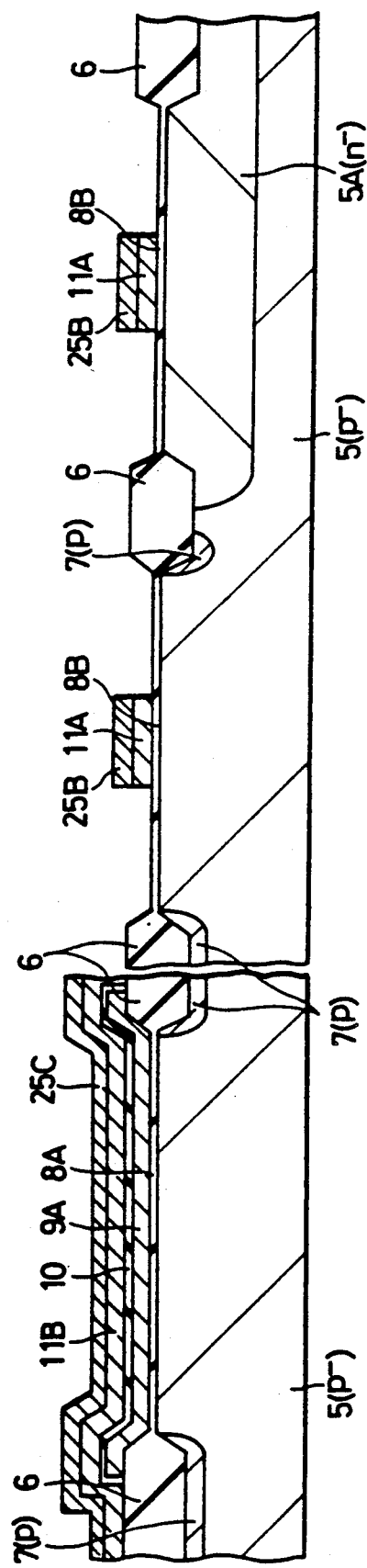
FIGS. 14 through 16 are sectional views snowing the principal portions of the memory cells of the EPROM and the CMIS constituting the peripheral circuit at a predetermined production step, and useful for explaining the production method in accordance with the third embodiment of the present invention.

The conductive layers 11 and 25 of the region, in which the field effect transistor of the peripheral circuit is to be formed, are simultaneously etched, thereby forming the conductive layers 11A and 25B to serve as the gate electrode, respectively, as shown in FIG. 14.

Figure 15:
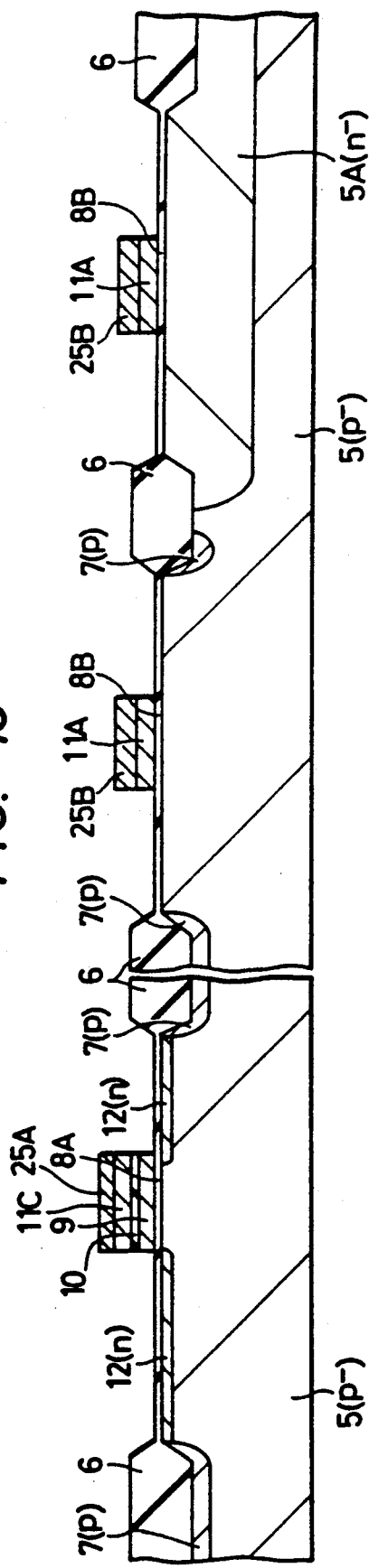

After this step, substantially the same production step as that of the first embodiment shown in FIG. 7 is carried out in order to form the conductive layer 9 which is to serve as the floating gate and the conductive layers 11C and 25A which are to serve as the control gate. After ion implantation to form an n type semiconductor region 12, the conductive layers 25A and 25B are heat-treated to reduce their resistance. This heat-treatment provides the semiconductor region 12 as shown in FIG. 15.

Figure 16:
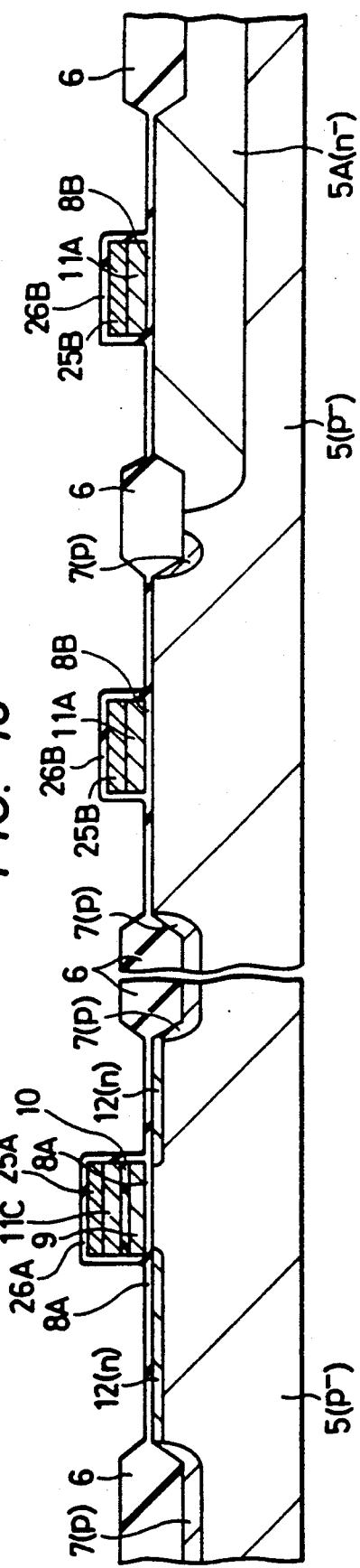

An insulating film 26A covering the conductive layers 9 and 11C, 25A is then formed as shown in FIG. 16 in order to improve the retention characteristics of the charge to be stored in the conductive layer 9. Another insulating film 26B covering the conductive layers 11A and 25B is formed by the step of forming the insulating film 26A described above. The n type semiconductor region 12A may be formed after the insulating films 16A and 26B have been formed. The insulating films 26A and 26B may be composed of silicon oxide film by the thermal oxidation technique at 900° C. for 20 minutes in the dry $O_2$ atmosphere. When the insulating film 8A is formed so as to be about 300 to 500 Å thick, for example, the insulating films may be from about 300 to about 500 Å thick. This step of forming the insulating films 26A and 26B can increase the thickness of the insulating films 8A and 8B that have become thin at the time of the forming FAMOS and MISFET of the peripheral circuit.

The thermal oxidation time for forming these insulating films 26A and 26B is much shorter than when oxidation is effected through a mask for introducing an impurity, as will be described later. The insulating film 26A may be formed in such a manner as to at least cover the conductive layer 9.

For reference, the thermal oxidation technique for forming the conductive layer 25 by the refractory metal film is disclosed in "Transactions of No. 44 Applied Physics Conference", Autumn, 1983, p 410 (25a-N-10), and U.S. Pat. No. 4,505,028.

In this case, an oxide film is not formed on the surface of the conductive layer 25 (25A and 25B) which is a metal, but covers the surfaces of the conductive layers 9, 11C and 11A. To improve the charge retention time of the memory cell, however, it is only necessary that the oxide film covers at least the conductive layer 9; hence, there is no problem at all in this case.

Thereafter, the subsequent steps of the first embodiment shown in FIG. 8 and so on are carried out to complete the EPROM of this embodiment.

The third embodiment of the invention can provide substantially the same effect as that of the first embodiment.

The resistance of the control gate and word line of the field effect transistor of the memory cell and that of the gate electrode of the field effect transistor of the peripheral circuit can be reduced by forming them with a refractory metal or silicide, so that the operating speed of EPROM can be improved.

Figure 17:
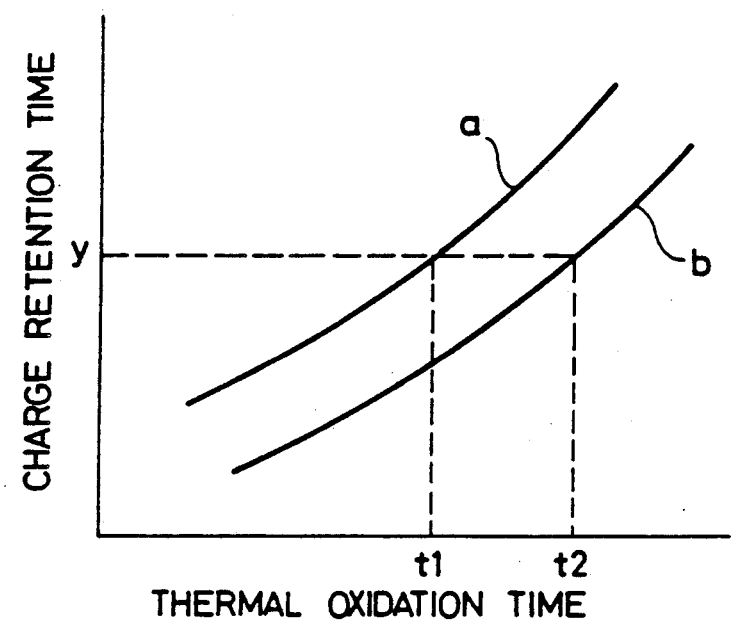
FIG. 17 is a diagram showing the relation between a thermal oxidation time and a charge retention time, useful for explaining the third embodiment of the present invention.
Figure 18:
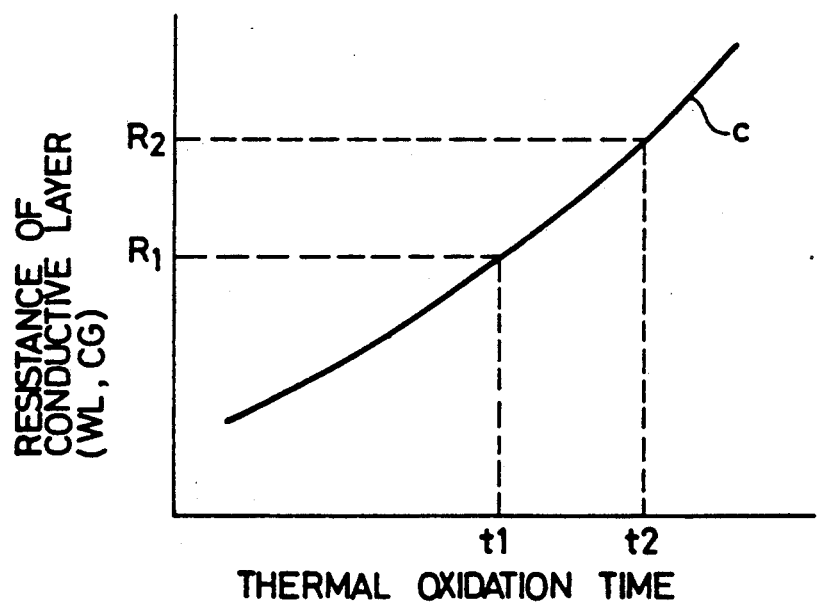
FIG. 18 is a diagram showing the relation between the thermal oxidation time and the resistance of a conductive layer, useful for explaining the third embodiment of the present invention.

FIG. 17 is a diagram which shows the relation between the thermal oxidation time and the charge retention characteristics, useful for explaining the effect of this embodiment, and FIG. 18 is a diagram which shows the relation between thermal oxidation time and resistance of the conductive layers 11C, 25A (control gate electrode and word line) and 11A, 25B, useful for explaining the effect of this embodiment.

In FIGS. 17 and 18, the abscissa represents thermal oxidation time. Symbol $t_1$ represents thermal oxidation time required for forming the insulating film 26A, and $t_2$ represents the thermal oxidation time required for forming the dense silicon oxide film, which covers the conductive layer 9 and has the same film thickness as the insulating film 26, through the mask 14A.

In FIG. 17, the ordinate represents the retention time (years) of the charge stored in the conductive layer 9, and a curve a represents the relation between the thermal oxidation time and the charge retention characteristics when the insulating film 26A is formed in accordance with this embodiment. A curve b represents the relation when the insulating film is formed through the mask 14A. As can be seen clearly from FIG. 17, a predetermined charge retention year can be obtained by the extremely short thermal oxidation time $t_1$. A considerable time is necessary in order to form the silicon oxide film through the mask 14A. However, since the silicon oxide film (insulating film 26A) has been formed in this embodiment before the mask 14A is formed, the thermal oxidation time therefor may be extremely short.

In FIG. 18, the ordinate represents the resistance [$\Omega/\square$] of the conductive layer consisting of the conductive layers 11C, 25A or 11A, 15B. As can be seen clearly from FIG. 18, the extremely short thermal oxidation time $t_1$ does not increase the resistance of the conductive layer described above. Symbol $R_1$ represents the resistance of the conductive layer [$\Omega/\square$] described above at the thermal oxidation time $t_1$ and $R_2$ represents the resistance [$\Omega/\square$] of the conductive layer at thermal oxidation time $t_2$.

If the thermal oxidation time is long, the upper portions of the control gate electrode and word line formed integrally with the former and the upper portion of the gate electrode of the peripheral device are oxidized, and their cross-sectional areas decrease so that the resistance increases, an extended period of time is necessary before the start of the data read-out operation, and the operating speeds of the FAMOS and the peripheral device can not be improved.

As described above, the novel technical means disclosed in the present invention provides the following effects:

(1) The low impurity concentration region of the field effect transistor to serve as the memory cell has a lower impurity concentration than the source and drain regions, but has a higher impurity concentration than the low impurity concentration region of the field effect transistor of the peripheral circuit. This arrangement can increase the electric field developing in the low impurity concentration region (the drain region) of the field effect transistor serving as the memory cell more than when the same structure as that of the field effect transistor of the peripheral circuit is employed. Therefore, the writing efficiency of the EPROM can be improved.

(2) The field effect transistor as the memory cell employs an LDD structure and the impurity concentration of its low impurity concentration region is made relatively high. This arrangement can restrict the extension of the depletion region that extends from the p-n junction to the channel region, so that the field effect transistor as the memory cell can be made a short channel type.

(3) Due to the effect described in the item (2) above, the memory cell area can be reduced; hence, the integration density of the EPROM can be improved.

(4) The LDD portion of the field effect transistor serving as the memory cell, the LDD portion of the field effect transistor of the peripheral circuit and their substantial source and drain regions are formed separately, so that their impurity concentration can be set to the respective optimal values.

(5) Due to the effect described in the item (4) above, the substantial source and drain regions of the field effect transistor as the memory cell can be formed in a high impurity concentration, and its resistance can be reduced. Therefore, the reading efficiency can be improved.

(6) Due to the effects described in the items (4) and (5) above, the occupying area of the ground line extending in the memory cell array can be reduced, and the integration density of the EPROM can be therefore improved.

(7) After the silicon oxide film for improving the charge retention characteristics is formed in such a manner as to cover at least the floating gate, the impurity introduction mask for forming the substantial source and drain regions is then formed. Therefore, the thermal oxidation time necessary for forming the silicon oxide film described above can be shortened.

(8) Due to the effect described in the item (7) above, the increase of the resistance of each of the control gate electrode, the word line and the gate electrode of the peripheral device can be reduced; hence, the data read-out speed can be improved.

(9) Due to the effects described in the items (7) and (8) above, the retention characteristics of the charge as the data for the memory cell can be improved, and the operating speed of the FAMOS can be improved.

(10) Due to the effect described in the item (7), it is possible to prevent the source or drain region from reaching the portion below the gate electrode, so that a short channel transistor can be fabricated.

(11) The insulating film, that has become thick at the time of fabricating the gate electrode, can be made thick simultaneously with the formation of the silicon oxide film that improves the charge retention characteristcs. Therefore, the withstand voltage at the end portion of the gate electrode can be improved.

While the present invention has thus been described with reference to some preferred embodiments, it will be understood by those skilled in the art that the foregoing and other changes in form and details can be made therein without departing from the spirit and scope of the invention.

For example, the present invention can be widely applied to semiconductor devices equipped with MISFETs having a laminate structure of two or more conductive layers on the gate electrode, besides FAMOS.

What is claimed is:

1. A method of producing a semiconductor device provided with first and second MISFETs, each having a gate electrode and a semiconductor region as a source or drain region, said semiconductor region comprising a first semiconductor region and a second semiconductor region, the second semiconductor region being formed between said first semiconductor region and said gate electrode, said second semiconductor region having a lower impurity concentration than that of said first semiconductor region, said method comprising:
   a step of forming said second semiconductor region of said first MISFET after forming said gate electrode;
   a step of forming said second semiconductor region of said second MISFET after forming said gate electrode, said second semiconductor region of said second MISFET having a lower impurity concentration than that of said second semiconductor region of said first MISFET; and
   a step of forming said first semiconductor region after forming said second semiconductor region.

2. A method of producing a semiconductor device according to claim 1 wherein the second semiconductor regions of said first and second MISFETs are formed by ion implantation using said gate electrode as a mask.

3. A method of producing a semiconductor device according to claim 2 wherein an impurity is also implanted into a region in which said first MISFET is to be formed, when ion implantation is effected in order to form said second semiconductor region of said second MISFET.

4. A method of producing a semiconductor device according to claim 1 wherein said ion implantation to form said second semiconductor regions of said first and second MISFETs is made substantially in the doses of $10^{13}$–$10^{15}$ atoms/cm$^2$ and $10^{13}$ atoms/cm$^2$, respectively.

5. A method of producing a semiconductor device according to claim 1 wherein said first semiconductor regions of said first and second MISFETs are formed by ion implantation using said gate electrode and side walls formed on the two sides of said gate electrode as masks.

6. A method of producing a semiconductor device according to claim 1 wherein said second semiconductor region is shallower than said first semiconductor region.

7. A method of producing a semiconductor device according to claim 1 further comprising P-channel MISFETs, wherein said first and second MISFETs are N-channel MISFETs.

8. A method of producing a semiconductor device according to claim 7 further comprising:
   a step of covering said second MISFET and said P-channel MISFET with a first mask; and
   a step of covering at least said P-channel MISFET with a second mask.

9. A method of producing a semiconductor device according to claim 8 wherein said second mask covers said first MISFET.

10. A method of producing a semiconductor device according to claim 1 wherein said second semiconductor region of said first MISFET is formed in self-alignment with said gate electrode of said first MISFET by ion implantation, and said second semiconductor region of said second MISFET is formed in self-alignment with said gate electrode of said second MISFET by ion implantation.

11. A method of producing a semiconductor device according to claim 10 wherein said second semiconductor region of said first MISFET is formed by ion implantation using arsenic ions, and said second semiconductor region of said second MISFET is formed by ion implantation using phosphorus ions.

12. A method of producing a semiconductor device according to claim 11 wherein said first semiconductor regions of said first and second MISFETs are formed in self-alignment with said gate electrode and side walls formed ont he two sides of said gate electrode, by ion implantation.

13. A method of producing a semiconductor device according to claim 12 wherein said side walls are comprised of silicon oxide films formed by a chemical vapor deposition method.

14. A method of producing a semiconductor device provided with first and second N-channel MISFETs and a P-channel MISFET, the source or drain regions of said first and second N-channel MISFETs comprising a first semiconductor region and a second semiconductor region, the second semiconductor region being formed between said first semiconductor region and the gate electrode, said second semiconductor region having a lower impurity concentration than that of said first semiconductor region, said method comprising:
   a step of forming said gate electrode;
   a step of forming said second semiconductor region of said first N-channel MISFET after forming said gate electrode;
   a step of forming said second semiconductor region of said second N-channel MISFET after forming said gate electrode, said second semiconductor region of said second N-channel MISFET having a lower impurity concentration than that of said second semiconductor region of said first N-channel MISFET;
   a step of forming said first semiconductor region after forming said second semiconductor region; and
   a step of forming a semiconductor region as the source or drain region of said P-channel MISFET.

15. A method of producing a semiconductor device having first and second MISFETs, comprising:
   a step of forming first and second gate electrodes of the first MISFET, said second gate electrode being formed on an insulating film on said first gate electrode;
   a step of forming a gate electrode of said second MISFET;

a step of covering at least the exposed surface of said first and second gate electrodes of said first MISFET with an insulating film, and forming a first semiconductor region as part of at least one of source region and drain region of said first MISFET, said first semiconductor region being formed in self-alignment with said first and second gate electrodes of the first MISFET;

a step of forming a second semiconductor region as a part of at least one of a source region or drain region of said second MISFET, said second semiconductor region being formed in self-alignment with said gate electrode of said second MISFET, said second semiconductor region having a lower impurity concentration than an impurity concentration of said first semiconductor region;

a step of forming side walls on the sides of said gate electrode of said second MISFET; and a step of forming a third semiconductor region as a part of the at least one of the source or drain region of said second MISFET, the third semiconductor region being formed in self-alignment with said gate electrode of said second MISFET with said side walls thereof, said third semiconductor region having a higher impurity concentration than that of said second semiconductor region.

16. A method of producing a semiconductor device according to claim 15 wherein said insulating film is a thermal oxidation film.

17. A method of producing a semiconductor device according to claim 16 wherein said insulating film is formed prior to said step of forming side walls.

18. A method of producing a semiconductor device according to claim 15 wherein the second semiconductor region of said second MISFET is formed by ion implantation using said gate electrode of said second MISFET as a mask.

19. A method of producing a semiconductor device according to claim 18 wherein the third semiconductor region of said second MISFET is formed by ion implantation using said gate electrode and side walls formed on the two sides of said gate electrode as masks.

20. A method of producing a semiconductor device according to claim 15 wherein the second semiconductor region is shallower than said third semiconductor region.

21. A method of producing a semiconductor device according to claim 15 wherein said second MISFET is a P-channel MISFET, and wherein said first MISFET is an N-channel MISFET.

22. A method of producing a semiconductor device according to claim 15 wherein said first MISFET forms a memory cell, and said second MISFET is included in a peripheral circuit, of said semiconductor device.

23. A method of producing a semiconductor device according to claim 22 wherein said insulating film of the first MISFET is a thermal oxidation film.

24. A method of producing a semiconductor device according to claim 23 wherein each of the first, second and third semiconductor regions is formed by ion implantation.

25. A method of producing a semiconductor device according to claim 23 wherein said first semiconductor region is formed by ion implantation using arsenic ions.

26. A method of producing a semiconductor device according to claim 25 wherein said second semiconductor region is formed by ion implantation using phosphorus ions.

27. A method of producing a semiconductor device according to claim 26 including a further step of forming a P-channel MISFET as part of the peripheral circuit of the semiconductor device.

28. A method of producing a semiconductor device according to claim 16, wherein said side walls are comprised of silicon oxide films formed by a chemical vapor deposition method.

29. A method of producing a semiconductor device according to claim 15, wherein the first and second semiconductor regions are formed by a first impurity introduction in self-alignment with the first and second gate electrodes of the first MISFET, so as to form a part of the first semiconductor region, and by a second impurity introduction in self-alignment with both the first and second gate electrodes, and with the gate electrode of the second MISFET, so as to form another part of the first semiconductor region and to form the second semiconductor region.

30. A method of producing a semiconductor device according to claim 15, wherein the step for forming the first semiconductor region and the step for forming the second semiconductor region are separate steps.

31. A method of producing a semiconductor device according to claim 15, wherein the second gate electrode, and said gate electrode of said second MISFET, each include a layer of refractory metal or platinum, or a layer of silicide of refractory metal or platinum.

32. A method of producing a semiconductor device according to claim 15 wherein said insulating film is a silicon dioxide film.

33. A method of producing a semiconductor device according to claim 15 including the further step of forming side walls on the sides of at least the first gate electrode of the first MISFET, and of forming a fourth semiconductor region as a part of the at least one of the source and drain regions in self-alignment with said first and second gate electrodes and the side walls on side thereof, said fourth semiconductor region having a higher impurity concentration than that of said first semiconductor region.

34. A method of producing a semiconductor device according to claim 33 wherein side walls are formed on sides of both the first and second gate electrodes of the first MISFET.

35. A method of producing a semiconductor device according to claim 33 wherein the third and fourth semiconductor regions are formed simultaneously.

36. A method of producing a semiconductor device having a memory cell constituted by a first MISFET and having a peripheral circuit constituted by a second MISFET, the source or drain regions of said first and second MISFETs each comprising a first semiconductor region and a second semiconductor region, the second semiconductor region being formed between said first semiconductor region and a channel forming region, the first MISFET having a first gate electrode and a second gate electrode formed on an insulating film disposed on said first gate electrode, the second MISFET having a gate electrode, each of the first and second gate electrodes and the gate electrode having side wall insulating films on sides thereof, said method comprising:

a step of forming said second semiconductor region of said first MISFET after forming said first and second gate electrodes of said first MISFET;

a step of forming said second semiconductor region of said second MISFET after forming said gate electrode of said second MISFET, said second semiconductor region of said second MISFET having a lower impurity concentration than the impurity concentration of said second semiconductor region of said first MISFET; and a step of forming said first semiconductor region after forming said second semiconductor region of each of the first and second MISFETs.

37. A method of producing a semiconductor device according to claim 36 wherein the second semiconductor regions of said first and second MISFETs are formed by ion implantation using said first and second gate electrodes, and said gate electrode, respectively, as masks.

38. A method of producing a semiconductor device according to claim 36 wherein the second semiconductor regions of the first and second MISFETs is shallower than said first semiconductor region.

39. A method of producing a semiconductor device according to claim 36 further comprising P-channel MISFETs, wherein said first and second MISFETs are N-channel MISFETs.

40. A method of producing a semiconductor device according to claim 36 wherein the second gate electrode comprises a film including a refractory metal as its principal component.

41. A method of producing a semiconductor device according to claim 37 wherein the first semiconductor region of said first and second MISFETs is formed by ion implantation using said first and second gate electrodes and side walls formed on the two sides of the first and second gate electrodes, and said gate electrode and side walls formed on the two sides of said gate electrode, respectively, as masks.

42. A method of producing a semiconductor device according to claim 36 wherein said second semiconductor region of said first MISFET is formed in self-alignment with said first and second gate electrodes of said first MISFET by ion implantation, and said second semiconductor region of said second MISFET is formed in self-alignment with said gate electrode of said second MISFET by ion implantation.

43. A method of producing a semiconductor device according to claim 42 wherein said second semiconductor region of said first MISFET is formed by ion implantation using arsenic ions, and said second semiconductor region of said second MISFET is formed by ion implantation using phosphorus ions.

44. A method of producing a semiconductor device according to claim 43 wherein said first semiconductor regions of said first and second MISFETs are formed in self-alignment with, respectively, said first and second gate electrodes and side walls formed on the two sides thereof, and said gate electrode and side walls formed on the two sides thereof, by ion implantation.

45. A method of producing a semiconductor device according to claim 44 wherein said side walls are comprised of silicon oxide films formed by a chemical vapor deposition method.

* * * * *